(12) United States Patent
Chen

(10) Patent No.: US 9,425,776 B2
(45) Date of Patent: Aug. 23, 2016

(54) METHOD FOR DETECTING HYSTERESIS CHARACTERISTIC OF COMPARATOR AND SEMICONDUCTOR DEVICE

(71) Applicant: FUJITSU LIMITED, Kawasaki-shi, Kanagawa (JP)

(72) Inventor: Yanfei Chen, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/728,730

(22) Filed: Jun. 2, 2015

(65) Prior Publication Data

US 2015/0358006 A1    Dec. 10, 2015

(30) Foreign Application Priority Data

Jun. 4, 2014   (JP) .................................. 2014-115974

(51) Int. Cl.
*H03L 5/00*   (2006.01)
*H03K 5/003*   (2006.01)
*H03K 5/24*   (2006.01)

(52) U.S. Cl.
CPC . *H03K 5/003* (2013.01); *H03K 5/24* (2013.01)

(58) Field of Classification Search
CPC .................................. H03K 5/003; H03K 5/24
USPC .................... 327/205, 307, 518, 590
See application file for complete search history.

(56) References Cited

U.S. PATENT DOCUMENTS

| | | | | | |
|---|---|---|---|---|---|
| 4,940,907 | A | * | 7/1990 | Laude | H03K 5/2481 327/73 |
| 5,426,386 | A | * | 6/1995 | Matthews | G01R 19/16542 327/205 |
| 6,982,582 | B1 | * | 1/2006 | Cheng | H03K 3/02337 327/205 |
| 7,382,167 | B1 | * | 6/2008 | Umminger | G06F 1/28 327/75 |
| 8,901,980 | B1 | * | 12/2014 | Naish | H03K 3/3565 327/205 |
| 2006/0164404 | A1 | * | 7/2006 | Maone | H03K 5/088 345/204 |
| 2008/0150589 | A1 | * | 6/2008 | Blackall | H03K 3/3565 327/65 |
| 2014/0043085 | A1 | * | 2/2014 | Motz | G01R 33/0035 327/307 |

FOREIGN PATENT DOCUMENTS

| | | |
|---|---|---|
| JP | 5-63527 A | 3/1993 |
| JP | 2011-151452 A | 8/2011 |

* cited by examiner

*Primary Examiner* — William Hernandez
(74) *Attorney, Agent, or Firm* — Arent Fox LLP

(57) ABSTRACT

A method for detecting a hysteresis characteristic of a comparator, include: causing a controller to control an offset adjuster configured to adjust an offset amount of the comparator; causing the controller to change the offset amount from a first value toward a second value and detect a third value when a logic level of a signal output from the comparator is changed; causing the controller to change the offset amount from the second value toward the first value and detect a fourth value when the logic level is changed; and causing the controller to detect the hysteresis characteristic of the comparator based on a first difference between the third value and the fourth value.

7 Claims, 9 Drawing Sheets

METHOD FOR DETECTING HYSTERESIS CHARACTERISTIC OF COMPARATOR AND SEMICONDUCTOR DEVICE

CROSS-REFERENCE TO RELATED APPLICATION

This application is based upon and claims the benefit of priority of the prior Japanese Patent Application No. 2014-115974, filed on Jun. 4, 2014, the entire contents of which are incorporated herein by reference.

FIELD

The embodiments discussed herein are related to a method for detecting a hysteresis characteristic of a comparator and a semiconductor device.

BACKGROUND

Input sensitivity of a comparator is determined based on an offset, a hysteresis characteristic, and the like. If the offset is not provided and the difference between two voltages input to the comparator is 0 V, a logic level of a voltage output from the comparator is reversed from a high (H) level to a low (L) level or from the L level to the H level. However, if the offset is provided and the difference between the input voltages is 0 V, the logic level of the voltage output from the comparator is not reversed. If the offset is provided and the difference is a positive or negative value (hereinafter referred to as offset amount), the logic level of the output voltage is reversed.

The hysteresis characteristic is a characteristic in which the difference between the input voltages when the logic level of the output voltage is changed from the H level to the L level is different from the difference between the input voltages when the logic level of the output voltage is changed from the L level to the H level. The hysteresis characteristic occurs when the comparator is not completely reset or the like. Hereinafter, the difference between the difference between input voltages when a logic level of an output voltage is changed from an H level to an L level and the difference between the input voltages when the logic level of the output voltage is changed from the L level to the H level is referred to as a hysteresis amount.

In order to increase the input sensitivity of the comparator, it is considered that the offset amount and the hysteresis amount are reduced. However, there are a case where the offset amount is set as a reference value of the comparator and a case where the hysteresis amount is set to a certain value as measures against noise.

Japanese Laid-open Patent Publications Nos. 2011-151452 and 5-63527 are examples of related art.

In order to detect the hysteresis characteristic, it is considered that the amplitude of an analog voltage to be input to the comparator is changed, a point at which the logic level of the output voltage is reversed is found by an analog measurer, and the hysteresis amount is calculated. This method, however, is cumbersome.

SUMMARY

According to an aspect of the invention, a method for detecting a hysteresis characteristic of a comparator, include: causing a controller to control an offset adjuster configured to adjust an offset amount of the comparator; causing the controller to change the offset amount from a first value toward a second value and detect a third value when a logic level of a signal output from the comparator is changed; causing the controller to change the offset amount from the second value toward the first value and detect a fourth value when the logic level is changed; and causing the controller to detect the hysteresis characteristic of the comparator based on a first difference between the third value and the fourth value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments are described with reference to the accompanying drawings.

First Embodiment

Figure 1:
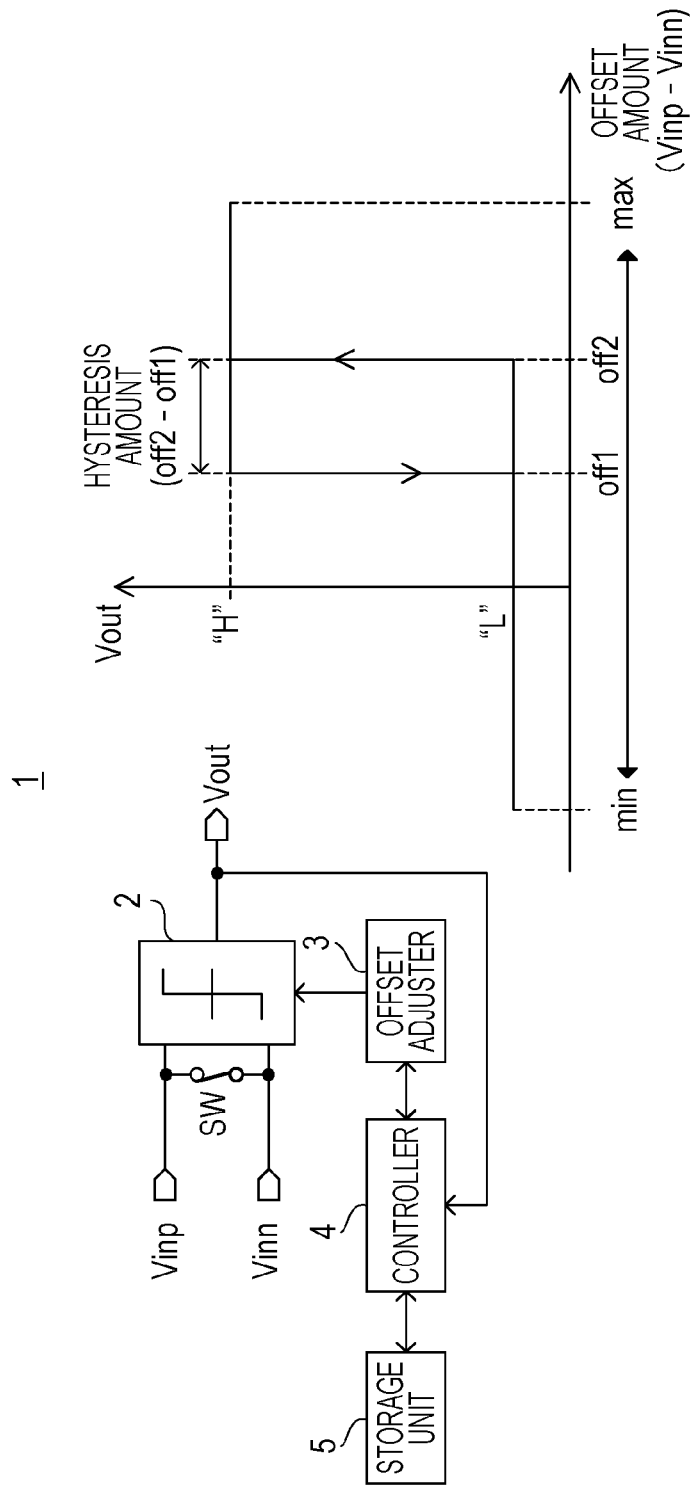
FIG. 1 is a diagram describing an example of a semiconductor device according to a first embodiment and an example of a method for detecting a hysteresis characteristic of a comparator.
Figure 2:
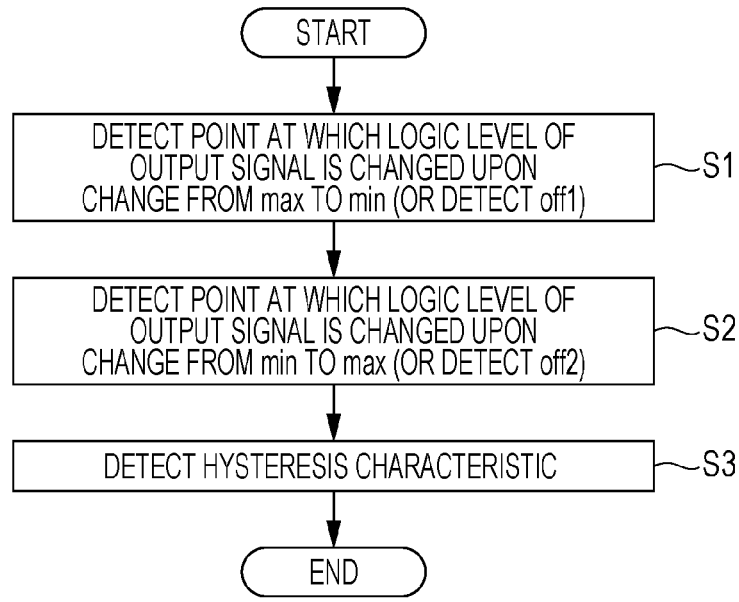
FIG. 2 is a flowchart of an example of the method for detecting the hysteresis characteristic according to the first embodiment.

FIG. 1 is a diagram describing an example of a semiconductor device according to a first embodiment and an example of a method for detecting a hysteresis characteristic of a comparator. FIG. 2 is a flowchart of an example of the method for detecting the hysteresis characteristic according to the first embodiment.

A semiconductor device 1 includes a comparator 2, an offset adjuster 3, a controller 4, a storage unit 5, and a switch SW.

The comparator 2 compares values of two input signals (hereinafter referred to as input voltages Vinp and Vinn) with each other and outputs a value (hereinafter referred to as output voltage Vout) based on a result of the comparison.

The offset adjuster 3 adjusts an offset amount of the comparator 2.

The controller 4 controls the offset adjuster 3 and thereby detects a hysteresis characteristic of the comparator 2 in the following manner. The following process is executed in a state in which two input terminals of the comparator 2 are short-circuited by the switch SW.

As illustrated in FIG. 2, the controller 4 controls the offset adjuster 3 and thereby changes the offset amount corresponding to the difference between the input voltage Vinp and the input voltage Vinn from a value max toward a value min. In this case, the controller 4 detects an offset amount off1 when a logic level (hereinafter also referred to as output logic level) of the voltage Vout output from the comparator 2 is changed (in step S1). In the example illustrated in FIG. 1, the offset amount off1 when the output logic level of the comparator 2 is reversed from an H level to an L level is detected. The controller 4 causes the detected offset amount off1 to be stored in the storage unit 5, for example.

The value max is the maximum value of the offset amount able to be adjusted by the offset adjuster 3, while the value min is the minimum value of the offset amount able to be adjusted by the offset adjuster 3.

Next, the controller 4 controls the offset adjuster 3 and thereby changes the offset amount from the value min toward the value max. In this case, the controller 4 detects an offset amount off2 when the output logic level of the comparator 2 is changed (in step S2). In the example illustrated in FIG. 1, the offset amount off2 when the output logic level of the comparator 2 is changed from the L level to the H level is detected. The controller 4 causes the detected offset amount off2 to be stored in the storage unit 5, for example.

Next, the controller 4 detects the hysteresis characteristic of the comparator 2 based on the difference between the detected offset amounts off1 and off2 (in step S3). As illustrated in FIG. 1, the offset amount corresponds to the difference between the input voltages Vinp and Vinn. Thus, based on the difference between the offset amounts off2 and off1 that is the difference between the difference between the input voltages Vinp and Vinn when the output logic level is changed from the H level to the L level and the difference between the input voltages Vinp and Vinn when the output logic level is changed from the L level to the H level, the hysteresis amount may be calculated and the hysteresis characteristic may be detected.

According to the semiconductor device 1 according to the first embodiment and the method for detecting the hysteresis characteristic of the comparator 2, the controller 4 controls the offset adjuster 3 configured to originally adjust the offset amount in the aforementioned manner. Thus, a cumbersome operation of changing the amplitude of an analog signal input to the comparator 2 and detecting the hysteresis characteristic from a change in output may be omitted and the hysteresis characteristic of the comparator 2 may be relatively easily detected.

The values max and min may not be the maximum and minimum values of the offset amount able to be adjusted by the offset adjuster 3 and may be set to values in a range able to be adjusted by the offset adjuster 3.

The controller 4 may cause adjustment codes (digital values) supplied to the offset adjuster 3 to be stored in the storage unit 5, instead of the storage of the detected offset amounts off1 and off2 in the storage unit 5, when the offset amount is the offset amount off1 or off2.

The order that step S1 is executed and the order that step S2 is executed may be switched with each other.

Second Embodiment

Figure 3:
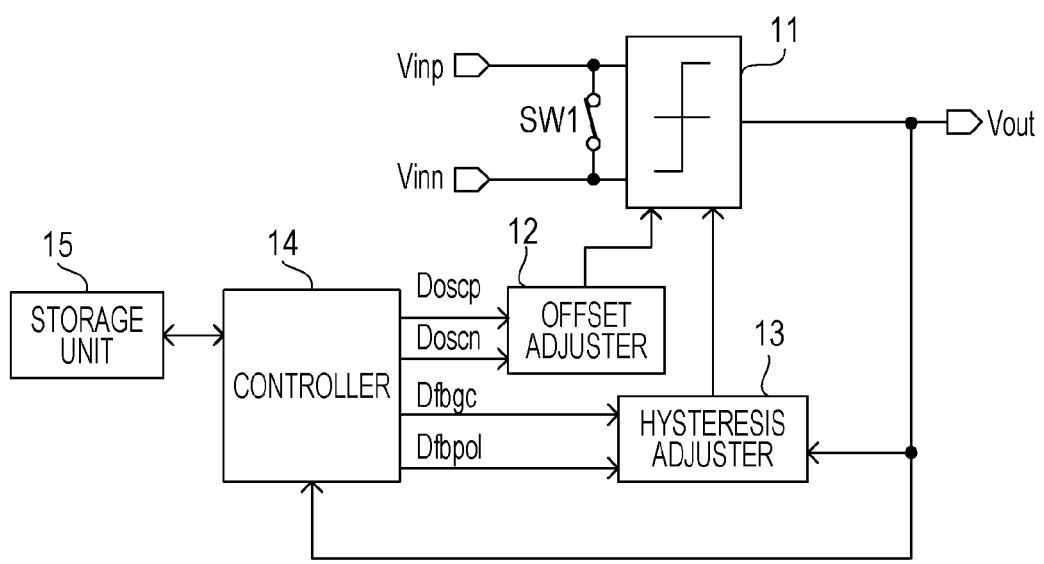
FIG. 3 is a diagram illustrating an example of a semiconductor device according to a second embodiment.

FIG. 3 is a diagram illustrating an example of a semiconductor device according to a second embodiment.

A semiconductor device 10 includes a comparator 11, an offset adjuster 12, a hysteresis adjuster 13, a controller 14, a storage unit 15, and a switch SW1.

The comparator 11 compares the input voltages Vinp and Vinn with each other and outputs the output voltage Vout based on a result of the comparison in the same manner as the comparator 2 according to the first embodiment.

The offset adjuster 12 adjusts an offset amount of the comparator 11.

The hysteresis adjuster 13 adjusts a hysteresis characteristic under control by the controller 14.

The controller 14 controls the offset adjuster 12 and detects the hysteresis characteristic. In addition, the controller 14 causes the hysteresis adjuster 13 to adjust the hysteresis characteristic based on the detected hysteresis characteristic.

The storage unit 15 stores digital adjustment codes Doscp, Doscn, Dfbgc, Dfbpol, and the like that are supplied by the controller 14 to the offset adjuster 12 and the hysteresis adjuster 13, for example.

The switch SW1 operates under control by the controller 14. For example, upon the detection of the hysteresis characteristic, the switch SW1 is turned on so as to short-circuit two input terminals of the comparator 11. Upon an operation of comparing the input voltages Vinp and Vinn with each other, the switch SW1 is turned off.

Figure 4:
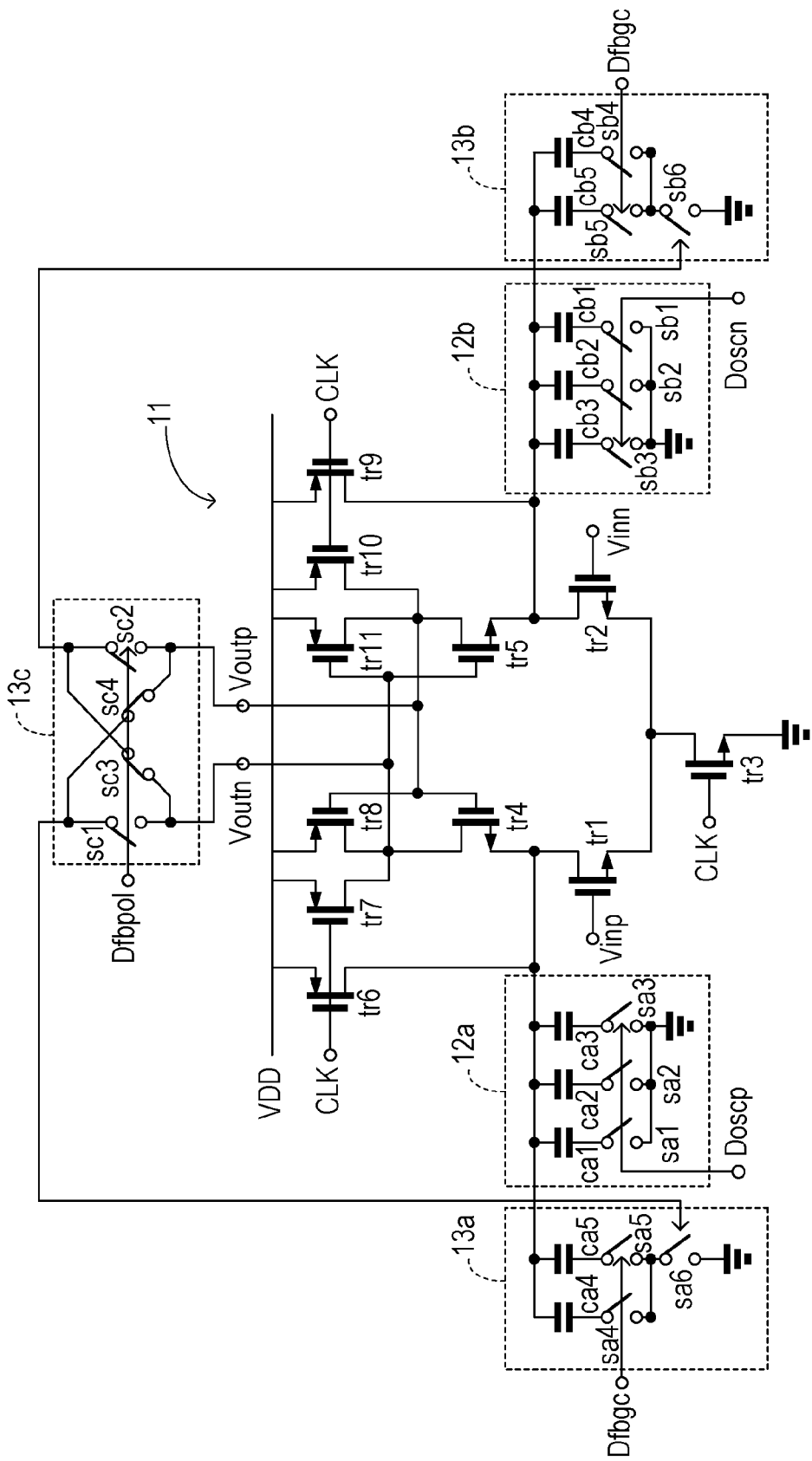
FIG. 4 is a circuit diagram of an example of a comparator, an offset adjuster, and a hysteresis adjuster.

FIG. 4 is a circuit diagram illustrating an example of the comparator, the offset adjuster, and the hysteresis adjuster.

The comparator 11 has transistors tr1 to tr11. In the example illustrated in FIG. 4, the transistors tr1 to tr5 are n-channel metal-oxide semiconductor field effect transistors (MOSFETs), while the transistors tr6 to tr11 are p-channel MOSFETs.

The input voltage Vinp is applied to a gate of the transistor tr1, while the input voltage Vinn is applied to a gate of the transistor tr2. Upon the detection, adjustment, and the like of the hysteresis characteristic, the gates are short-circuited by the switch SW1 illustrated in FIG. 3. A drain of the transistor tr3 is connected to sources of the transistors tr1 and tr2, and a source of the transistor tr3 is grounded. A clock CLK is supplied from a clock generator (not illustrated) to a gate of the transistor tr3.

Drains of the transistors tr1 and tr2 are connected to sources of the transistors tr4 and tr5, respectively. A drain of the transistor tr4 is connected to drains of the transistors tr7 and tr8, a gate of the transistor tr5, and a gate of the transistor tr11. In the example illustrated in FIG. 4, the comparator 11 outputs differential output signals, and a drain voltage of the transistor tr4 is an output voltage Voutn that is one of the differential output signals. In addition, a drain of the transistor tr5 is connected to a drain of the transistor tr10, a drain of the transistor tr11, and gates of the transistors tr4 and tr8. A drain voltage of the transistor tr5 is an output voltage Voutp that is the other differential output signal.

A power-supply voltage VDD is applied to sources of the transistors tr6 to tr11, while clocks CLK are supplied to gates of the transistors tr6, tr7, tr9, and tr10. A drain of the transistor tr6 is connected to the drain of the transistor tr1 and the source of the transistor tr4, while a drain of the transistor tr9 is connected to the drain of the transistor tr2 and the source of the transistor tr5.

The offset adjuster 12 illustrated in FIG. 3 is illustrated as two offset adjusters 12a and 12b in the example of FIG. 4.

The offset adjuster 12a includes capacitors ca1, ca2, and ca3 and switches sa1, sa2, and sa3. Terminals of the capacitors ca1 to ca3 are connected to the drain of the transistor tr1, a drain of the transistor tr6, and the source of the transistor tr4. Other terminals of the capacitors ca1 to ca3 are connected to terminals of the switches sa1 to sa3, while other terminals of the switches sa1 to sa3 are grounded. The switches sa1 to sa3 are controlled and turned on and off by the adjustment code Doscp supplied from the controller 14.

The offset adjuster 12b includes capacitors cb1, cb2, and cb3 and switches sb1, sb2, and sb3. Terminals of the capacitors cb1 to cb3 are connected to the drains of the transistors tr2 and tr9 and the source of the transistor tr5. Other terminals of the capacitors cb1 to cb3 are connected to terminals of the switches sb1 to sb3, while other terminals of the switches sb1 to sb3 are grounded. The switches sb1 to sb3 are controlled and turned on and off by the adjustment code Doscn supplied from the controller 14.

The switches sa1 to sa3 and sb1 to sb3 may be achieved by MOSFETs, for example. In the example illustrated in FIG. 4, the offset adjusters 12a and 12b each have three capacitors and three switches in order to simplify the drawing. The numbers of capacitors and switches that are included in the offset adjusters 12a and 12b are not limited to three and may be four or more.

Feedback gain adjusters 13a and 13b and a feedback polarity changer 13c that are illustrated in FIG. 4 function as the hysteresis adjuster 13 illustrated in FIG. 3.

The feedback gain adjuster 13a includes capacitors ca4 and ca5 and switches sa4, sa5, and sa6. Terminals of the capacitors ca4 and ca5 are connected to the drains of the transistors tr1 and tr6 and the source of the transistor tr4. Other terminals of the capacitors ca4 and ca5 are connected to terminals of the switches sa4 and sa5. Other terminals of the switches sa4 and sa5 are connected to a terminal of the switch sa6, while another terminal of the switch sa6 is grounded. The switches sa4 and sa5 are controlled and turned on and off by the adjustment code Dfbgc supplied from the controller 14. The switch sa6 is controlled and turned on and off by a control voltage supplied from the feedback polarity changer 13c.

The feedback gain adjuster 13b includes capacitors cb4 and cb5 and switches sb4, sb5, and sb6. Terminals of the capacitors cb4 and cb5 are connected to the drains of the transistors tr2 and tr9 and the source of the transistor tr5. Other terminals of the capacitors cb4 and cb5 are connected to terminals of the switches sb4 and sb5. Other terminals of the switches sb4 and sb5 are connected to a terminal of the switch sb6, while another terminal of the switch sb6 is grounded. The switches sb4 and sb5 are controlled and turned on and off by the adjustment Dfbgc supplied from the controller 14. The switch sb6 is controlled and turned on and off by a signal from the feedback polarity changer 13c.

The feedback polarity changer 13c includes switches sc1, sc2, sc3, and sc4. Terminals of the switches sc1 and sc3 are connected to the drain of the transistor tr4 and the like and receive the voltage Voutn output from the comparator 11. Terminals of the switches sc2 and sc4 are connected to the drain of the transistor tr5 and the like and receive the voltage Voutp output from the comparator 11. Another terminal of the switch sc1 is connected to another terminal of the switch sc4. Voltages of the other terminals of the switches sc1 and sc4 are control voltages for controlling the switch sa6 of the feedback gain adjuster 13a. Another terminal of the switch sc2 is connected to another terminal of the switch sc3. Voltages of the other terminals of the switches sc2 and sc3 are control voltages for controlling the switch sb6 of the feedback gain adjuster 13b. The switches sc1 to sc4 are controlled and turned on and off by the adjustment code Dfbpol supplied from the controller 14.

The switches sa4 to sa6, sb4 to sb6, and sc1 to sc4 may be achieved by MOSFETs, for example. In the example illustrated in FIG. 4, the feedback gain adjusters 13a and 13b each include two capacitors in order to simplify the drawing. The numbers of capacitors included in the feedback gain adjusters 13a and 13b are not limited to two and may be three or more.

Next, an example of a method for detecting the hysteresis characteristic of the comparator 11 is described.

Method for Detecting Hysteresis Characteristic

Figure 5:
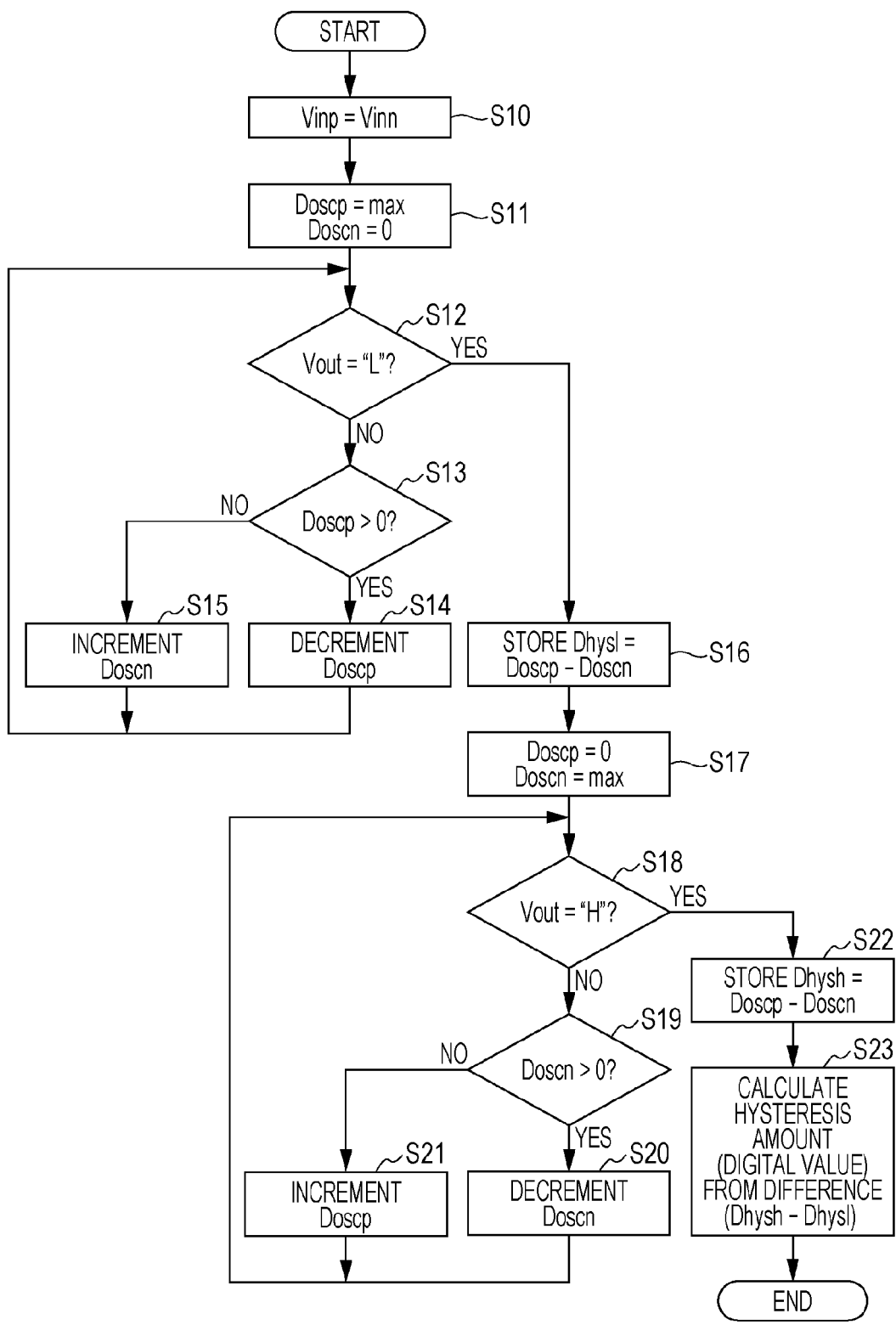
FIG. 5 is a flowchart of an example of a method for detecting a hysteresis characteristic.

FIG. 5 is a flowchart of the example of the method for detecting the hysteresis characteristic.

Figure 6:
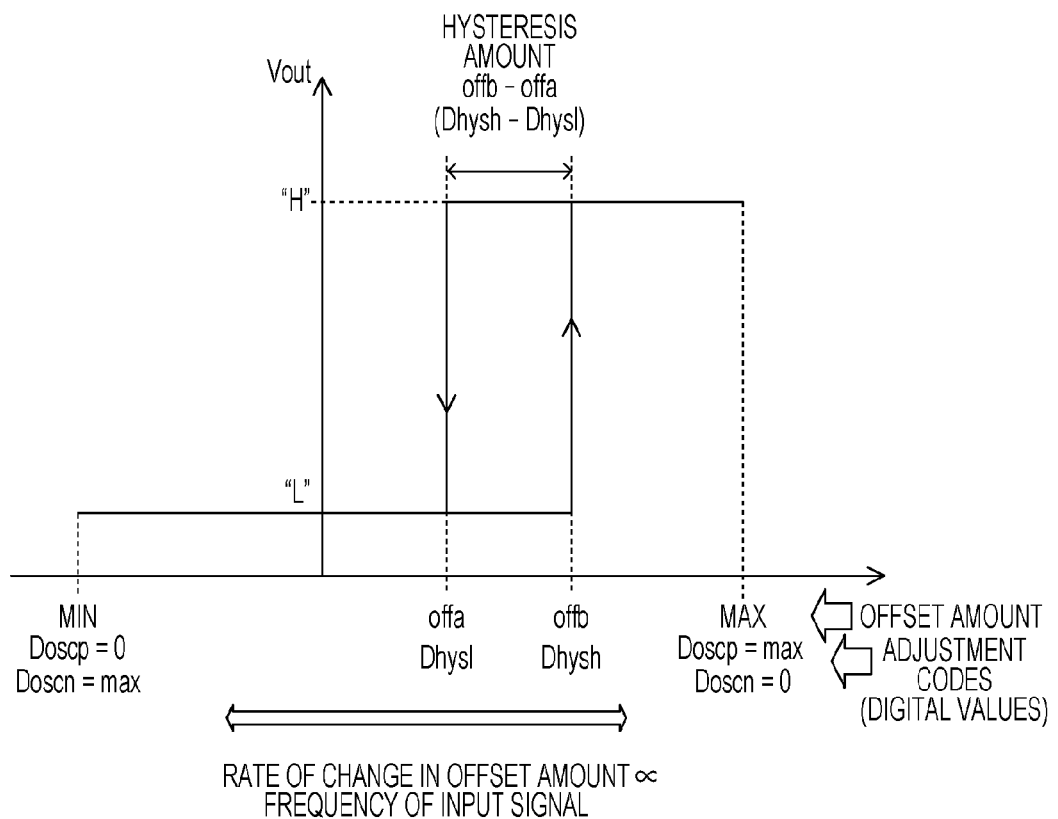
FIG. 6 is a diagram describing an example of the detection of the hysteresis characteristic.

FIG. 6 is a diagram describing the example of the detection of the hysteresis characteristic. In FIG. 6, the abscissa represents the offset amount (or an adjustment code (digital value) corresponding to the offset amount), and the ordinate represents the output voltage Vout.

First, the controller 14 turns on the switch SW1 and sets the input voltage Vinp and the input voltage Vinn so as to ensure that the input voltages Vinp and Vinn are equal to each other (in step S10). In this case, a bias voltage is applied to the input terminals of the comparator 11 by a bias voltage generator (not illustrated).

Next, the controller 14 sets the adjustment code Doscp to a maximum value (max) and sets the adjustment code Doscn to 0 (in step S11). The adjustment code Doscp is supplied to the offset adjuster 12a and used for adjustment of a positive-side offset amount, as illustrated in FIG. 4. The adjustment code Doscn is supplied to the offset adjuster 12b and used for adjustment of a negative-side offset amount, as illustrated in FIG. 4. The adjustment codes Doscp and Doscn are digital values, for example.

In the process of step S11, the controller 14 sets the adjustment code Doscp to the maximum value (max) and thereby turns on all the switches sa1 to sa3 illustrated in FIG. 4 and sets the positive-side offset amount to a maximum value (MAX), as illustrated in FIG. 6.

Next, the controller 14 determines whether or not the logic level of the voltage Vout output from the comparator 11 is the L level (in step S12). If the logic level of the output voltage Vout is not the L level, the controller 14 determines whether or not the adjustment code Doscp is larger than 0 (in step S13). If the adjustment code Doscp is larger than 0, the controller 14 decrements the adjustment Doscp (in step S14) so as to reduce the positive-side offset amount and repeats the process from step S12. When the adjustment code Doscp becomes 0, the controller 14 increments the adjustment Doscn (in step S15) so as to reduce the negative-side offset amount and repeats the process from step S12. This is due to the fact that the hysteresis characteristic may be considered to appear in a region in which the offset amount is negative.

When the positive-side offset amount is reduced (or the negative-side offset amount is increased), the logic level of the output voltage Vout is reversed from the H level to the L level at a certain point. In the example illustrated in FIG. 6, when the offset amount is offa, the logic level of the output voltage Vout is reversed from the H level to the L level. The controller 14 causes the difference (Docsp−Doscn) between the adjustment codes Doscp and Doscn upon the reversal to be stored as a digital value Dhysl in the storage unit 15 (in step S16).

Next, the controller 14 sets the adjustment code Doscn to the maximum value (max) and sets the adjustment code Doscp to 0 (in step S17). In the process of step S17, the controller 14 turns on all the switches sb1 to sb3 of the offset adjuster 12b illustrated in FIG. 4 by setting the adjustment code Doscn to the maximum value (max). This minimizes the negative-side offset amount (represented by "MIN"), as illustrated in FIG. 6.

Next, the controller 14 determines whether or not the logic level of the voltage Vout output from the comparator 11 is the H level (in step S18). If the logic level of the output voltage Vout is not the H level, the controller 14 determines whether or not the adjustment code Doscn is larger than 0 (in step S19). If the adjustment code Doscn is larger than 0, the controller 14 decrements the adjustment Doscn (in step S20) so as to increase the negative-side offset amount and repeats the process from step S18. When the adjustment code Doscn becomes 0, the controller 14 increments the adjustment code Doscp (in step S21) so as to increase the positive-side offset amount and repeats the process from step S18.

When the negative-side offset amount is increased (or the positive-side offset amount is increased), the logic level of the output voltage Vout is reversed from the L level to the H level at a certain point. In the example illustrated in FIG. 6, when the offset amount is offb, the logic level of the output voltage Vout is reversed from the L level to the H level. The controller 14 causes the difference (Doscp−Doscn) between the adjustment codes Doscp and Doscn upon the reversal to be stored as a digital value Dhysh in the storage unit 15 (in step S22).

Next, the controller 14 reads the digital values Dhysl and Dhysh from the storage unit 15 and calculates a digital value corresponding to a hysteresis amount (offb−offa) from the difference (Dhysh−Dhysl) between the digital values Dhysl and Dhysh (in step S23).

The hysteresis characteristic of the comparator 11 may be detected by the aforementioned process.

As illustrated in FIG. 6, the controller 14 may determine a rate of changing the offset amount based on a frequency of a signal input to the comparator 11. For example, the controller 14 changes the offset amount in proportion to the frequency of the input signal or at the same rate as the frequency of the input signal, for example. This may enable the hysteresis characteristic depending on the frequency of the input signal to be detected.

In addition, the order that the processes of steps S11 to S16 are executed and the order that the processes of steps S17 to S22 are executed may be switched with each other. Specifically, after the processes of steps S17 to S22 are executed, the processes of steps S11 to S16 may be executed.

Next, an example of the method for detecting the hysteresis characteristic in consideration of noise is described, in which the detection of an erroneous hysteresis characteristic is suppressed even if the logic level of the output voltage Vout is reversed due to the noise.

Method For Detecting Hysteresis Characteristic In Consideration Of Noise

Figure 7A:
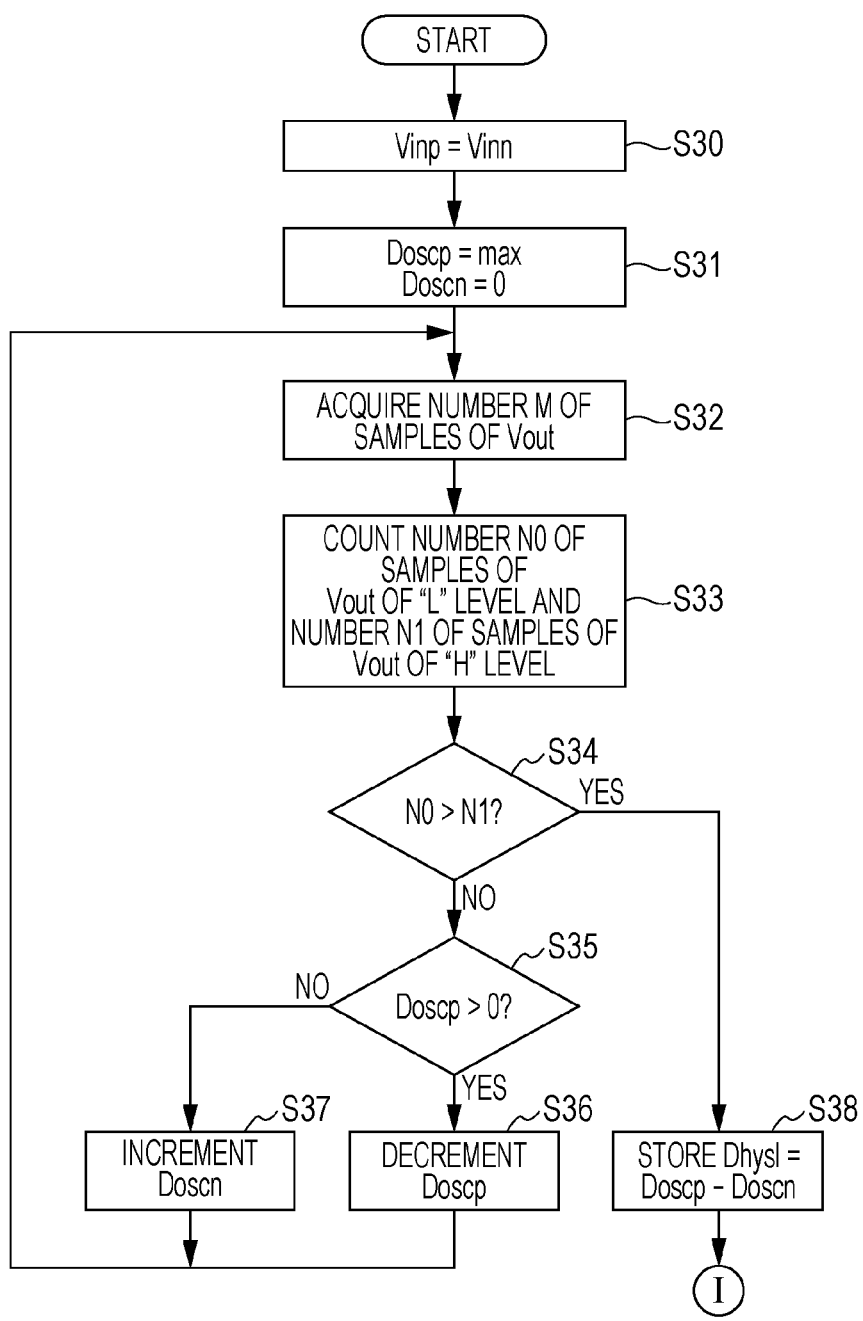
FIGS. 7A and 7B are a flowchart of an example of the method for detecting the hysteresis characteristic in consideration of noise.
Figure 7B:
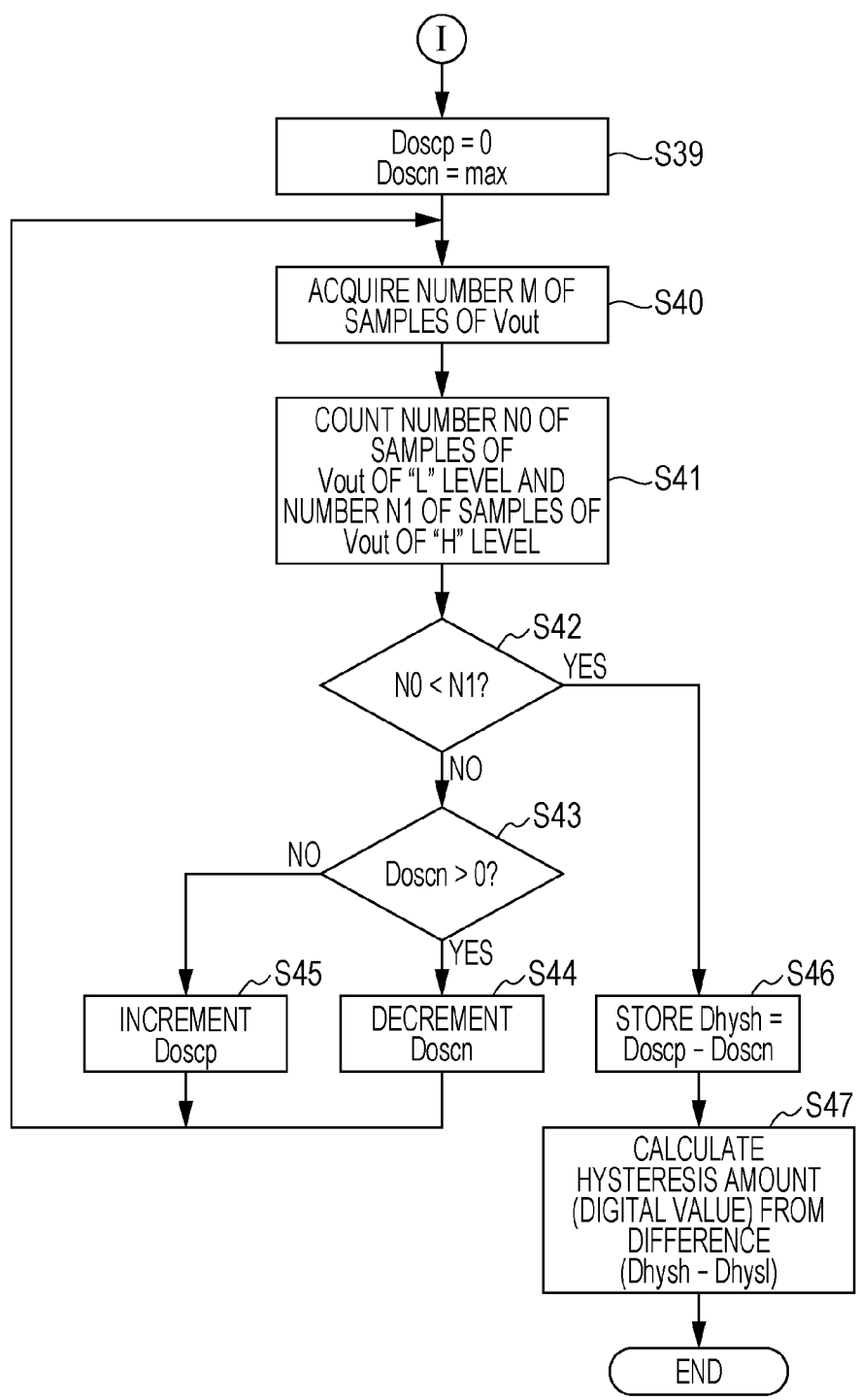

FIGS. 7A and 7B are a flowchart of an example of the method for detecting the hysteresis characteristic in consideration of noise.

Processes of steps S30 and S31 are the same as the processes of steps S10 and S11 illustrated in FIG. 5.

After the process of step S31, the controller 14 acquires a plurality (number M) of samples of values of the output voltage Vout (in step S32). Then, the controller 14 counts a number N0 of samples that are among the number M of the acquired samples and represent that the logic level of the output voltage Vout is the L level, and the controller 14 counts a number N1 of samples that are among the number M of the acquired samples and represent that the logic level of the output voltage Vout is the H level (in step S33). Then, the controller 14 determines whether or not N0>N1 (in step S34).

If N0≤N1, the controller 14 determines that the logic level of the output voltage Vout is not reversed, and the controller 14 executes processes of steps S35, S36, and S37. The processes of steps S35 to S37 are the same as the processes of steps S13 to S15 illustrated in FIG. 5. After the processes of steps S36 and S37, the process is repeated from step S32.

If N0>N1, the controller 14 determines that the logic level of the output voltage Vout is reversed, and the controller 14 causes the difference (Doscp−Doscn) between the adjustment codes Doscp and Doscn upon the reversal to be stored as the digital value Dhysl in the storage unit 15 (in step S38).

After that, the controller 14 sets the adjustment code Doscn to the maximum value (max) and sets the adjustment code Doscp to 0 in the same manner as the process of step S17 illustrated in FIG. 5 (in step S39). Processes of steps S40 and S41 are the same as the processes of steps S32 and S33. After counting the number N0 of the samples of the L level and the number N1 of the samples of the H level, the controller 14 determines whether or not N0<N1 (in step S42).

If N0≥N1, the controller 14 determines that the logic level of the output voltage Vout is not reversed, and the controller 14 executes processes of steps S43, S44, and S45. The processes of steps S43 to S45 are the same as the processes of steps S19 to S21 illustrated in FIG. 5. After the processes of steps S44 and S45, the process is repeated from step S40.

If N0<N1, the controller 14 determines that the logic level of the output voltage Vout is reversed, and the controller 14 causes the difference (Doscp−Doscn) between the adjustment codes Doscp and Doscn upon the reversal to be stored as the digital value Dhysh in the storage unit 15 (in step S46). A process of step S47 to be executed after step S46 is the same as the process of step S23 illustrated in FIG. 5.

As described above, in the process illustrated in FIGS. 7A and 7B, the controller 14 acquires the plurality of samples of the output voltage Vout and determines, based on the result of comparing the numbers of the samples of the logic levels, whether or not the logic level is reversed. This process may suppress the detection of an erroneous hysteresis characteristic even if the logic level of the output voltages Vout is reversed due to noise.

Next, an example of the adjustment of the hysteresis characteristic using the hysteresis adjuster 13 is described.

Example of Adjustment of Hysteresis Characteristic

Figure 8:
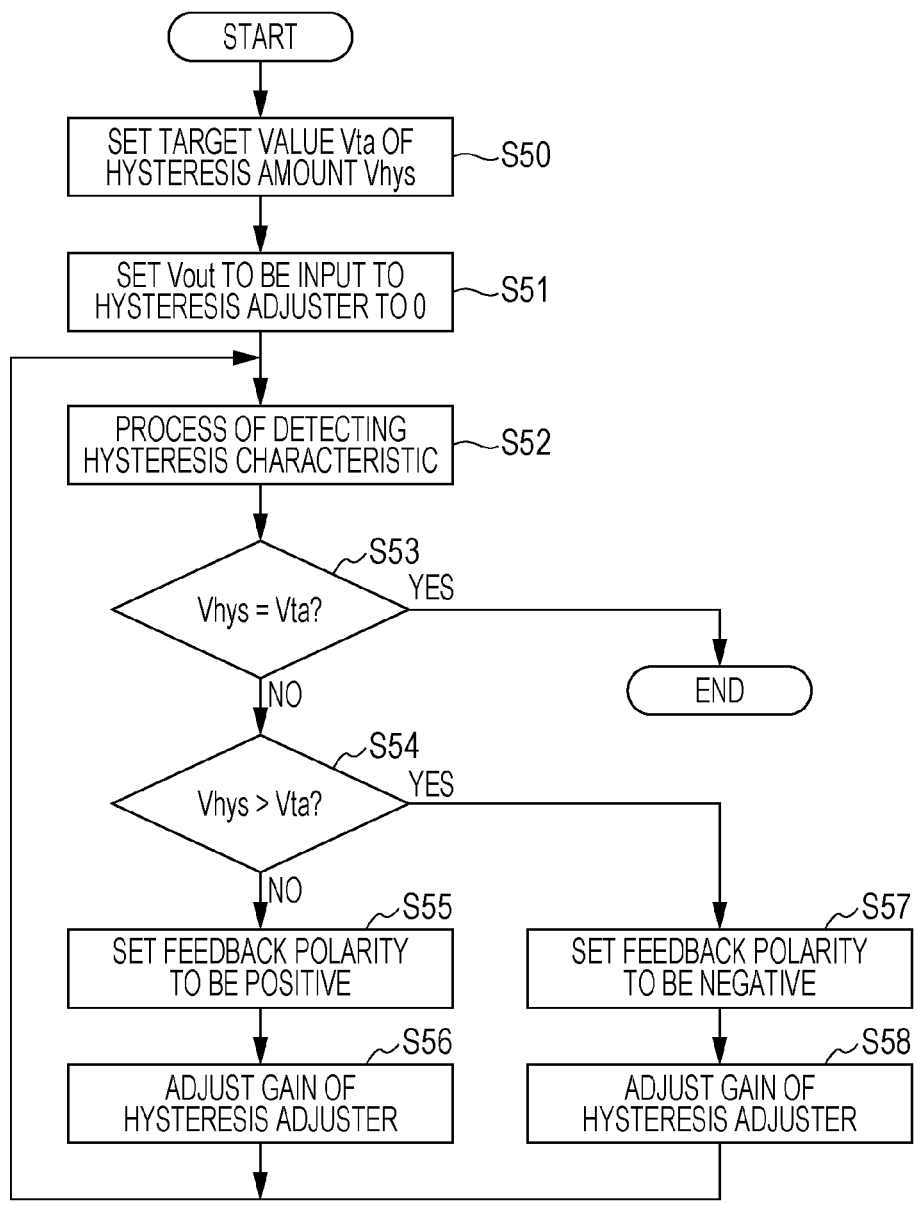
FIG. 8 is a flowchart of an example of a process of adjusting the hysteresis characteristic.

FIG. 8 is a flowchart of an example of a process of adjusting the hysteresis characteristic.

The controller 14 sets a target value Vta of a hysteresis amount Vhys based on input from a user or the like and causes the target value Vta to be stored in the storage unit 15, for example (in step S50). In addition, the controller 14 initially sets the output voltage Vout to be supplied to the hysteresis adjuster 13 to 0 (in step S51). Subsequently, the process of detecting the hysteresis characteristic as illustrated in FIG. 5 or FIGS. 7A and 7B is executed (in step S52).

The controller 14 determines whether or not the hysteresis amount Vhys detected by the process of detecting the hysteresis characteristic is equal to the target value Vta (in step S53). If the hysteresis amount Vhys is not equal to the target value Vta, the controller 14 determines whether or not the hysteresis amount Vhys is larger than the target value Vta (in step S54). If the hysteresis amount Vhys is smaller than the target value Vta, the controller 14 sets a feedback polarity to be positive by the adjustment code Dfbpol (in step S55).

In the present embodiment, setting the feedback polarity to be positive indicates that the value of (Vinp−Vinn) is adjusted and increased upon the next comparison by the comparator 11 when the logic level of the voltage Voutp output from the comparator 11 is the H level.

In order to execute the adjustment, the controller 14 turns on the switches sc3 and sc4 of the feedback polarity changer 13c and turns off the switches sc1 and sc2 by the adjustment code Dfbpol. Thus, if the logic level of the output voltage Voutp is the H level, the switch sa6 of the feedback gain adjuster 13a is turned on and the switch sb6 of the feedback gain adjuster 13b is turned off. The switches sa6 and sb6 are turned on by the signal of the H level and turned off by the signal of the L level. If the logic level of the output voltage Voutp is the L level, the switch sa6 is turned off and the switch sb6 is turned on.

After the feedback polarity is set to be positive, a gain of the feedback gain adjuster 13a or a gain of the feedback gain adjuster 13b is adjusted based on the adjustment code Dfbgc supplied from the controller 14 (in step S56). The gain adjustment is executed by enabling or disabling the capacitors ca4 and ca5 or cb4 and cb5 connected to the drain of the transistor tr1 or tr2 by the switches sa4 and sa5 or sb4 and sb5. The gain adjustment may be executed by an analog scheme. After that, the process is repeated from step S52.

If the hysteresis amount Vhys is larger than the target value Vta, the controller 14 sets the feedback polarity to be negative by the adjustment code Dfbpol (in step S57).

In the present embodiment, setting the feedback polarity to be negative indicates that the value of (Vinp−Vinn) is adjusted and reduced upon the next comparison by the comparator 11 when the logic level of the voltage Voutp output from the comparator 11 is the H level.

In order to execute the adjustment, the controller 14 turns on the switches sc1 and sc2 of the feedback polarity changer 13c and turns off the switches sc3 and sc4 by the adjustment code Dfbpol. Thus, if the logic level of the output voltage Voutp is the H level, the switch sa6 of the feedback gain adjuster 13a is turned off and the switch sb6 of the feedback gain adjuster 13b is turned on. The switches sa6 and sb6 are turned on by the signal of the H level and turned off by the signal of the L level. If the logic level of the output voltage Voutp is the L level, the switch sa6 is turned on and the switch sb6 is turned off.

After the feedback polarity is set to be positive, the gain of the feedback gain adjuster 13a or the gain of the feedback gain adjuster 13b is adjusted based on the adjustment code Dfbgc supplied from the controller 14 (in step S58). The gain adjustment is executed by enabling or disabling the capacitors ca4 and ca5 or cb4 and cb5 connected to the drain of the transistor tr1 or tr2 by the switches sa4 and sa5 or sb4 and sb5. The gain adjustment may be executed by an analog scheme. After that, the process is repeated from step S52.

When the controller 14 determines that the hysteresis amount Vhys is equal to the target value Vta in the process of step S53, the controller 14 terminates the process of adjusting the hysteresis characteristic. If the hysteresis amount Vhys does not completely match the target value Vta and becomes close to the target value Vta and is different from the target value Vta by a value in a predetermined range, the controller 14 may terminate the process of adjusting the hysteresis characteristic.

In this manner, the hysteresis adjuster 13 executes the gain adjustment and thereby adjusts the hysteresis characteristic (hysteresis amount) based on the result of comparing the target value with the hysteresis characteristic detected by the process of detecting the hysteresis characteristic as illustrated in FIG. 5 or FIGS. 7A and 7B.

As described above, according to the semiconductor device 10 according to the second embodiment and the method for detecting the hysteresis characteristic of the comparator 11, a cumbersome operation such as setting of analog input may be omitted by controlling the offset adjuster 12 as described with reference to FIG. 5 or FIGS. 7A and 7B. Thus, the hysteresis characteristic of the comparator 11 may be relatively easily detected and adjusted. In addition, since the hysteresis characteristic is detected and adjusted by the adjustment codes that are the digital values, these processes may be digitalized and automated.

Example of Application

Figure 9:
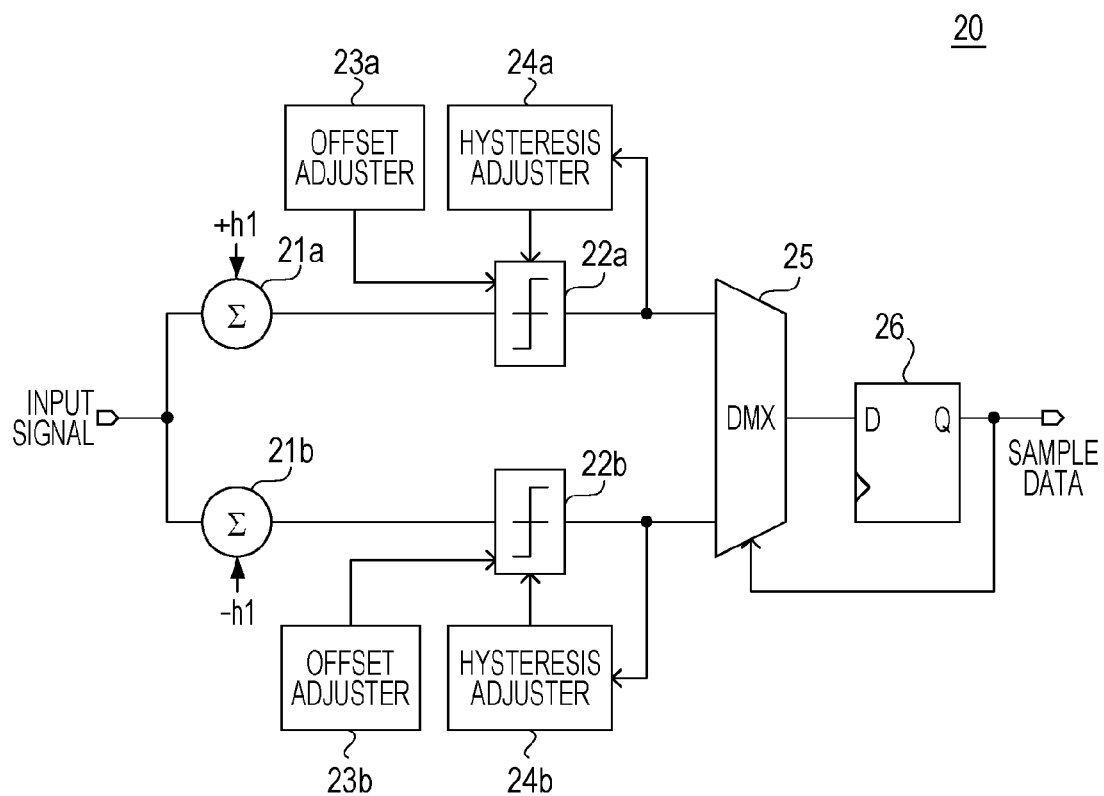
FIG. 9 is a diagram illustrating an example of a speculative decision feedback equalizer having a function of detecting and adjusting hysteresis characteristics.

FIG. 9 is a diagram illustrating an example of a speculative decision feedback equalizer having a function of detecting and adjusting hysteresis characteristics.

A speculative decision feedback equalizer (hereinafter referred to as speculative DFE) 20 selects any of results of comparing a plurality of thresholds with an input signal, based on a logic level of sample data of a previous clock, and makes determination about data, for example. The speculative DFE 20 is used by a receiving circuit in high-speed data communication, for example.

The speculative DFE 20 includes adders 21a and 21b, comparators 22a and 22b, offset adjusters 23a and 23b, hysteresis adjusters 24a and 24b, a demultiplexer (DMX) 25, and a flip flop 26.

The adders 21a and 21b use coefficients +h1 and −h1 to execute an equalization process on the analog input signal.

The comparators 22a and 22b compare different thresholds with signals output from the adders 21a and 21b and output results of the comparison.

The offset adjusters 23a and 23b adjust offset amounts of the comparators 22a and 22b based on adjustment codes supplied from a controller (not illustrated). In addition, the offset adjusters 23a and 23b adjust the offset amounts by the process illustrated in FIG. 5 or FIGS. 7A and 7B, and the controller (not illustrated) detects hysteresis characteristics of the comparators 22a and 22b.

The hysteresis adjusters 24a and 24b adjust the hysteresis characteristics of the comparators 22a and 22b by the process illustrated in FIG. 8, based on adjustment codes supplied from the controller (not illustrated).

The demultiplexer 25 selects, based on a value (sample data) output from the flip flop 26, any of the results of the comparison by the comparators 22a and 22b and outputs the selected result.

The flip flop 26 holds a signal output from the demultiplexer 25 and outputs the signal as sample data while being synchronized with a clock (not illustrated).

The method for detecting the hysteresis characteristic according to the present embodiment is not limited to the aforementioned circuits and is applicable to various circuits.

An aspect of the method for detecting the hysteresis characteristic of the comparator and the semiconductor device is described above based on the embodiments, while the method for detecting the hysteresis characteristic of the comparator and the semiconductor device are an example and are not limited to the above description.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for detecting a hysteresis characteristic of a comparator, comprising:
   causing a controller to control an offset adjuster configured to adjust an offset amount of the comparator;

causing the controller to change the offset amount from a first value toward a second value and detect a third value when a logic level of a signal output from the comparator is changed;

causing the controller to change the offset amount from the second value toward the first value and detect a fourth value when the logic level is changed; and causing the controller to detect the hysteresis characteristic of the comparator based on a first difference between the third value and the fourth value.

2. The method according to claim 1, wherein the controller controls the offset adjuster by a first digital adjustment code and causes a storage unit to store a first digital value of the first adjustment code when the offset amount is the third value and store a second digital value of the first adjustment code when the offset amount is the fourth value, and wherein the controller calculates a third digital value corresponding to the first difference based on a second difference between the first digital value and the second digital value.

3. The method according to claim 1, wherein the controller acquires a plurality of samples of the output signal when causing the offset adjuster to change the offset amount and determines, based on a result of comparing the number of first samples of a first logic level among the plurality of samples with the number of second samples of a second logic level among the plurality of samples, whether or not the logic level is changed.

4. The method according to claim 1, wherein the controller changes the offset amount at a rate based on a frequency of a signal input to the comparator.

5. The method according to claim 1, wherein the controller compares the first difference with a target value, controls a hysteresis adjuster configured to receive the signal output from the comparator, and adjusts a gain of the hysteresis adjuster so as to match the first difference with the target value.

6. The method according to claim 5, wherein the controller controls the hysteresis adjuster by a second digital adjustment code.

7. A semiconductor device comparing:

a comparator configured to compare a value of a first input signal with a value of a second input signal and output a result of the comparison;

an offset adjuster configured to adjust an offset amount of the comparator; and a controller configured to control the offset adjuster, change the offset amount from a first value toward a second value, detect a third value upon a change in a logic level of a signal output from the comparator, change the offset amount from the second value toward the first value, detect a fourth value upon a change in the logic level, and detect a hysteresis characteristic of the comparator based on a difference between the third value and the fourth value.

* * * * *